US009385666B2

(12) United States Patent
Tam et al.

(10) Patent No.: US 9,385,666 B2
(45) Date of Patent: Jul. 5, 2016

(54) POWER AMPLIFIER WITH WIDE BAND AM-AM FEEDBACK AND DIGITAL PRE-DISTORTION

(71) Applicant: Marvell World Trade LTD., St. Michael (BB)

(72) Inventors: Sai-Wang Tam, Sunnyvale, CA (US); Alden Chee Ho Wong, Hayward, CA (US); Yuan Lu, Sunnyvale, CA (US); David M. Signoff, Santa Clara, CA (US); Li Lin, Saratogoa, CA (US)

(73) Assignee: Marvell World Trade LTD., St. Michael (BB)

( * ) Notice: Subject to any disclaimer, the term of this patent is extended or adjusted under 35 U.S.C. 154(b) by 8 days.

(21) Appl. No.: 14/558,805

(22) Filed: Dec. 3, 2014

(65) Prior Publication Data

US 2015/0162882 A1 Jun. 11, 2015

Related U.S. Application Data

(60) Provisional application No. 61/913,602, filed on Dec. 9, 2013.

(51) Int. Cl.
*H03G 3/20* (2006.01)
*H03F 1/32* (2006.01)
*H03F 1/02* (2006.01)
*H03F 3/21* (2006.01)

(52) U.S. Cl.
CPC ............ *H03F 1/3247* (2013.01); *H03F 1/0216* (2013.01); *H03F 1/0266* (2013.01); *H03F 1/0272* (2013.01); *H03F 1/32* (2013.01); *H03F 1/3282* (2013.01); *H03F 3/21* (2013.01); *H03F 2200/129* (2013.01); *H03F 2200/18* (2013.01); *H03F 2201/3215* (2013.01)

(58) Field of Classification Search
None
See application file for complete search history.

(56) References Cited

U.S. PATENT DOCUMENTS

| 5,886,572 | A | * | 3/1999 | Myers | H03F 1/0222 330/10 |
| 7,602,244 | B1 | * | 10/2009 | Holmes | H03F 1/0266 330/149 |
| 2003/0197559 | A1 | * | 10/2003 | Ghannouchi | H03F 1/3282 330/149 |
| 2005/0242875 | A1 | * | 11/2005 | Gurvich | H03F 1/0211 330/136 |
| 2007/0139107 | A1 | * | 6/2007 | Dittmer | H03F 1/0222 330/136 |
| 2011/0063026 | A1 | * | 3/2011 | Jung | H03F 1/0266 330/149 |
| 2013/0285740 | A1 | * | 10/2013 | Cummins | H03F 1/0222 330/2 |
| 2014/0103996 | A1 | | 4/2014 | Horiguchi | |
| 2014/0133526 | A1 | * | 5/2014 | Camuffo | H03F 1/0233 375/219 |

FOREIGN PATENT DOCUMENTS

| WO | WO-9952204 A1 | 10/1999 |
| WO | WO-0163744 A2 | 8/2001 |
| WO | WO-2013054601 A1 | 4/2013 |

OTHER PUBLICATIONS

International Search Report for PCT/US2014/068358 mailed on Mar. 23, 2015; 4 Pages.

* cited by examiner

*Primary Examiner* — Patricia T Nguyen

(57) ABSTRACT

A system including an amplifier circuit configured to amplify an input and generate an output, a bias circuit configured to bias the amplifier circuit, and a feedback circuit configured to generate feedback based on the input and the output, and to adjust the bias of the amplifier circuit based on the feedback to reduce amplitude nonlinearity in the output. A digital pre-distortion circuit is configured to reduce phase nonlinearity in the output.

16 Claims, 8 Drawing Sheets

POWER AMPLIFIER WITH WIDE BAND AM-AM FEEDBACK AND DIGITAL PRE-DISTORTION

CROSS-REFERENCE TO RELATED APPLICATIONS

This application claims the benefit of U.S. Provisional Application No. 61/913,602, filed on Dec. 9, 2013. The entire disclosure of the application referenced above is incorporated herein by reference.

FIELD

The present disclosure relates generally to communication systems and more particularly to improving linearity and efficiency of power amplifiers used in communication devices.

BACKGROUND

Wi-Fi transmitters use power amplifiers to amplify transmit data. The power amplifiers can be of different types. For example, the power amplifiers can be class A, class B, or class AB type. Class A power amplifiers have high linearity but low efficiency. Class B power amplifiers have high efficiency but low linearity. Wi-Fi transmitters typically use orthogonal frequency division multiplexing (OFDM) to transmit data. Consequently, Wi-Fi transmitters require the power amplifiers to be linear over a large dynamic range. Wi-Fi transmitters typically use class AB power amplifiers to amplify transmit data. Class AB amplifiers are not as linear as class A amplifiers but are more linear than class B amplifiers. Class AB amplifiers are not as efficient as class B amplifiers but are more efficient than class A amplifiers. The linearity of class AB power amplifiers can be increased by increasing gate bias. Increasing the gate bias, however, increases power dissipation of class AB power amplifiers. The power dissipation can be reduced by decreasing the gate bias. Decreasing the gate bias, however, decreases the linearity of class AB power amplifiers.

SUMMARY

A system comprises an amplifier circuit, a bias circuit, a feedback circuit, and a digital pre-distortion circuit. The amplifier circuit is configured to amplify an input and generate an output. The bias circuit is configured to bias the amplifier circuit. The feedback circuit is configured to generate feedback based on the input and the output and to adjust the bias of the amplifier circuit based on the feedback to reduce amplitude nonlinearity in the output. The digital pre-distortion circuit is configured to reduce phase nonlinearity in the output.

In other features, the output of the amplifier circuit is a first output. The amplifier circuit comprises a pre-amplifier configured to amplify the input and generate a second output and a power amplifier configured to amplify the second output and generate the first output. The bias circuit is configured to bias the amplifier circuit by biasing the power amplifier. The feedback circuit is configured to adjust the bias of the amplifier circuit by adjusting the bias of the power amplifier.

In another feature, the digital pre-distortion circuit is configured to reduce residual phase nonlinearity generated by the feedback circuit in the output.

In another feature, the digital pre-distortion circuit is configured to reduce residual amplitude nonlinearity in the output.

In other features, the output of the amplifier circuit is a first output. The feedback circuit comprises an operational transconductance amplifier configured to receive the input and the first output and generate a second output and a transimpedance amplifier configured to receive the second output and generate a third output to adjust the bias of the amplifier circuit.

In other features, the operational transconductance amplifier comprises a comparator configured to compare amplitude information of the input and the first output and to generate current based on the comparison, and the transimpedance amplifier is configured to generate the second output based on the current.

In other features, the operational transconductance amplifier comprises a current source and first through sixth transistors each including a source terminal, a gate terminal, and a drain terminal. The source terminals of the first through fourth transistors are connected to the current source. The gate terminals of the first and second transistors are connected to the input. The gate terminals of the third and fourth transistors are connected to the first output. The drain terminals of the first and second transistors are connected to the drain terminal of the fifth transistor and a first input of the transimpedance amplifier. The drain terminals of the third and fourth transistors are connected to the drain terminal of the sixth transistor and a second input of the transimpedance amplifier. The source terminals of the fifth and sixth transistors are connected to a power supply. The gate terminal of the fifth transistor is connected to the gate terminal of the sixth transistor. A first resistance including first and second terminals respectively connected to the drain and gate terminals of the fifth transistor. A second resistance including first and second terminals respectively connected to the drain and gate terminals of the sixth transistor.

In another feature, the operational transconductance amplifier comprises a folded cascode stage coupled to the comparator to generate the current.

In other features, the operational transconductance amplifier comprises a current source and first through twelfth transistors each including a source terminal, a gate terminal, and a drain terminal. The source terminals of the first through fourth transistors are connected to the current source. The gate terminals of the first and second transistors are connected to the input. The gate terminals of the third and fourth transistors are connected to the first output. The drain terminals of the first and second transistors are connected to the drain terminal of the fifth transistor. The drain terminals of the third and fourth transistors are connected to the drain terminal of the sixth transistor. The source terminals of the fifth and sixth transistors are connected to a power supply and the source terminal of the seventh transistor. The gate terminals of the fifth, seventh, ninth, and eleventh transistors are respectively connected to the gate terminals of the sixth, eighth, tenth, and twelfth transistors. The drain terminals of the fifth and sixth transistors are respectively connected to the source terminals, of the seventh and eighth transistors. The drain terminals of the seventh and eight transistors are respectively connected to (i) the drain terminals of the ninth and tenth transistors and (ii) first and second inputs of the transimpedance amplifier. The source terminals of the ninth and tenth transistors are respectively connected to the drain terminals of the eleventh and twelfth transistors.

In other features, the output of the amplifier circuit is a first output. The feedback circuit comprises a first self-mixer configured to receive the input and generate a second output, a second self-mixer configured to receive the first output and generate a third output, and a transimpedance amplifier configured to receive the second output and the third output and generate a fourth output to adjust the bias of the amplifier circuit.

In other features, the output of the amplifier circuit is a first output. The feedback circuit comprises a first envelop detector configured to detect an envelope in the input and generate a second output and a second envelop detector configured to detect an envelope in the first output and generate a third output. A first analog-to-digital converter is configured to convert the second output and generate a fourth output, and a second analog-to-digital converter is configured to convert the third output and generate a fifth output. A digital signal processor is configured to process the fourth output and the fifth output and generate a digital bias signal to bias the amplifier circuit. An analog-to-digital converter is configured to convert the digital bias signal into an analog bias signal to bias the amplifier circuit.

In still other features, a method comprises amplifying an input using an amplifier circuit, generating an output based on amplifying the input, biasing the amplifier circuit, generating feedback based on the input and the output, adjusting the bias of the amplifier circuit based on the feedback to reduce amplitude nonlinearity in the output, and reducing phase nonlinearity in the output.

In other features, the output of the amplifier circuit is a first output. The method further comprises amplifying the input using a pre-amplifier, generating a second output based on amplifying the input using the pre-amplifier, amplifying the second output using a power amplifier, generating the first output based on amplifying the second output using the power amplifier, biasing the amplifier circuit by biasing the power amplifier, and adjusting the bias of the amplifier circuit by adjusting the bias of the power amplifier.

In another feature, the method further comprises reducing residual phase nonlinearity generated by the feedback in the output.

In another feature, the method further comprises reducing residual amplitude nonlinearity in the output.

In other features, the output of the amplifier circuit is a first output. The method further comprises generating a second output based on the input and the first output using an operational transconductance amplifier, generating a third output based on the second output using a transimpedance amplifier, and adjusting the bias of the amplifier circuit using the third output.

In other features, the method further comprises comparing amplitude information of the input and the first output, generating current based on the comparison, and generating the second output based on the current.

In another feature, the method further comprises generating the current using a folded cascode stage of the operational transconductance amplifier.

In other features, the output of the amplifier circuit is a first output. The method further comprises generating a second output based on the input using a first self-mixer, generating a third output based on the first output using a second self-mixer, and generating a fourth output based on the second output and the third output using a transimpedance amplifier to adjust the bias of the amplifier circuit.

In other features, the output of the amplifier circuit is a first output. The method further comprises generating a second output based on detecting an envelope in the input, generating a third output based on detecting an envelope in the first output, generating a fourth output by converting the second output from analog to digital form, generating a fifth output by converting the third output from analog to digital form, generating a digital bias signal to bias the amplifier circuit by processing the fourth output and the fifth output, and converting the digital bias signal into an analog bias signal to bias the amplifier circuit.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

The present disclosure relates to systems and methods that decrease the gate bias of class AB power amplifiers, which decreases the power dissipation of class AB power amplifiers, while also increasing the linearity of class AB power amplifiers over a large dynamic range. The class AB power amplifiers utilizing the systems and methods of the present disclosure are therefore suitable for use in Wi-Fi transmitters that use orthogonal frequency division multiplexing (OFDM) to transmit data.

The systems and methods of the present disclosure propose various feedback circuits that increase the efficiency of digital pre-distortion circuits used to reduce amplitude and phase nonlinearities from the output of power amplifiers. Specifically, as explained below, the proposed feedback circuits reduce amplitude nonlinearity in the output of the power amplifier so that the digital pre-distortion circuit can focus on reducing phase nonlinearity in the output of the power amplifier. The digital pre-distortion circuits also reduce any residual amplitude nonlinearity remaining in the output of the power amplifier and any residual phase nonlinearity introduced into the output of the power amplifier by the feedback circuits.

Figure 1:
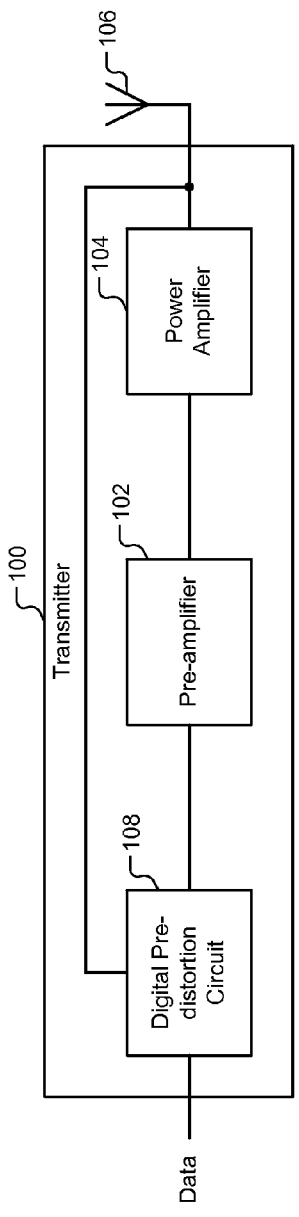
FIG. 1 is a functional block diagram of a transmitter.

FIG. 1 shows a transmitter 100 of a Wi-Fi device, for example. The transmitter 100 includes a preamplifier (PPA) 102, a power amplifier (PA) 104, and an antenna 106. The preamplifier 102 receives encoded and modulated data to be transmitted via the antenna 106. The preamplifier 102 amplifies the data. The power amplifier 104 amplifies an output of the preamplifier 102 and transmits the amplified data via the antenna 106.

For example, the power amplifier 104 includes a class AB power amplifier. The linearity of an amplifier can be measured in terms of the ability of the amplifier to accurately reproduce input signals as output. An amplitude-to-amplitude (AM-AM) distortion in the output of the power amplifier is referred to as AM-AM nonlinearity or amplitude nonlinearity, where AM denotes amplitude modulation. An amplitude-to-phase (AM-PM) distortion in the output of the power amplifier is referred to as AM-PM nonlinearity or phase nonlinearity, where PM denotes phase modulation.

The transmitter 100 includes a digital pre-distortion (DPD) circuit 108 to improve the linearity of the power amplifier 104. The DPD circuit 108 models the gain and phase characteristics of the power amplifier 104 and generates an output that includes an inverse of any distortion that may be present in the output of the power amplifier 104. The output of the DPD circuit 108 is fed to the power amplifier 104 to cancel the nonlinearity of the power amplifier 104. Accordingly, the output of the power amplifier 104 is more linear and includes less distortion than when the DPD circuit 108 is not used.

Figure 2:
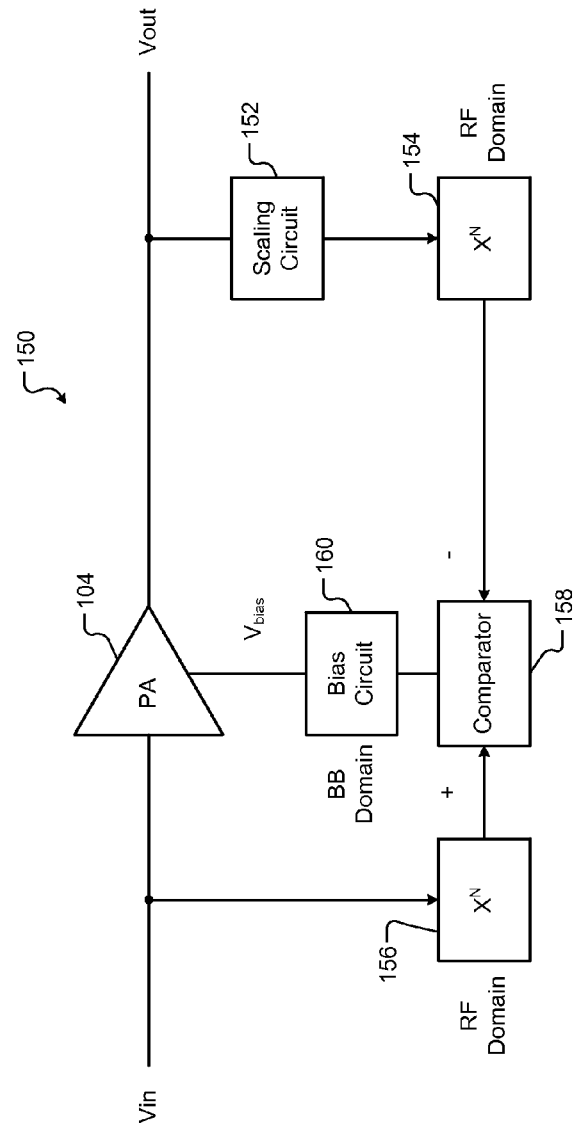
FIG. 2 is a functional block diagram of a feedback system that increases linearity of a power amplifier used in the transmitter of FIG. 1.

FIG. 2 shows a feedback circuit 150 that is configured to increase the linearity of the power amplifier 104. The feedback circuit 150 reduces the amplitude nonlinearity in the output of the power amplifier 104 and is therefore also referred to as AM-AM feedback loop. The feedback circuit 150 includes a scaling circuit 152, a first envelope detector 154, a second envelope detector 156, a comparator 158, and a bias circuit 160.

The scaling circuit 152 scales the output of the power amplifier 104. The first envelope detector 154 detects an envelope in the output of the power amplifier 104 and extracts envelope information (e.g., from DC up to envelope frequency (e.g., DC to 80 MHz, which is channel bandwidth)) from the output of the scaling circuit 152. The second envelope detector 156 detects an envelope in the input of the power amplifier 104 and extracts envelope information (e.g., from DC up to the channel bandwidth) from the input of the power amplifier 104.

The comparator 158 compares the outputs of the first and second envelope detectors 154, 156 and generates an output that indicates an amount of amplitude nonlinearity in the output of the power amplifier 104. The bias circuit 160 biases the power amplifier 104 based on the output of the comparator 158. The bias circuit 160 adjusts the bias voltage of the power amplifier 104 based on the amount of amplitude nonlinearity indicated by the comparator 158.

Figure 3:
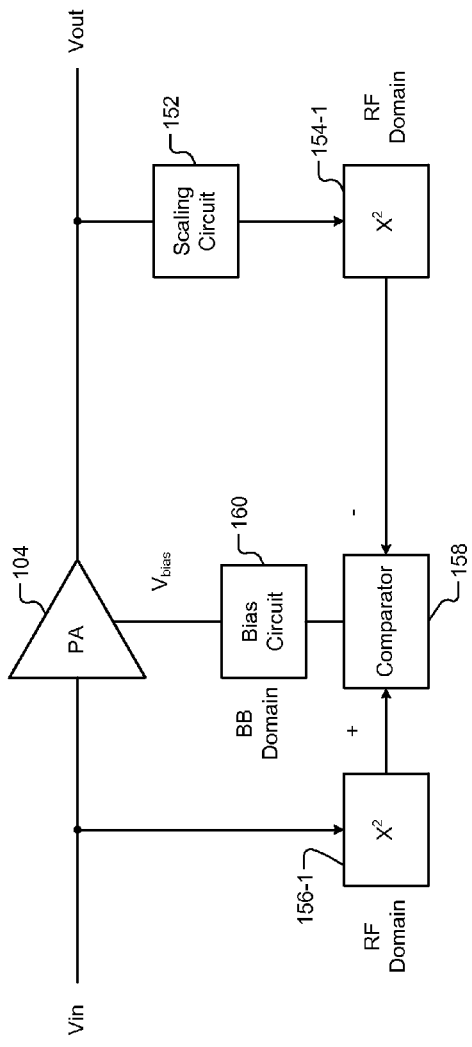
FIG. 3 shows a first example of the feedback system of FIG. 2.
Figure 4:
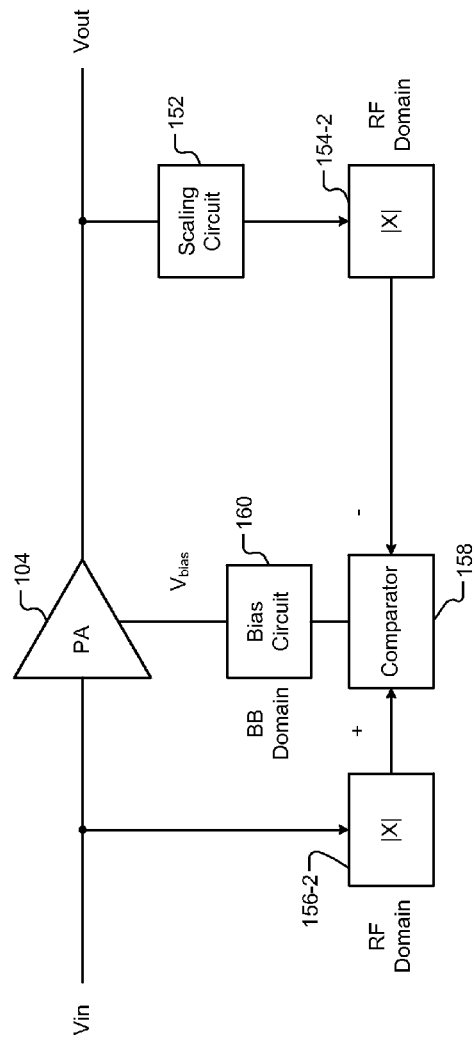
FIG. 4 shows a second example of the feedback system of FIG. 2.

FIG. 3 shows an example of the AM-AM feedback loop, where first and second envelope detectors 154-1, 156-1 each utilizes a square function to detect the envelope respectively in the input and the output of the power amplifier 104. FIG. 4 shows an example of the AM-AM feedback loop, where first and second envelope detectors 154-2, 156-2 each utilizes a modulus function to detect the envelope respectively in the input and the output of the power amplifier 104.

The digital pre-distortion (DPD) circuits typically correct both AM-AM and AM-PM nonlinearities of the power amplifiers. Instead, as explained below, the AM-AM feedback loop can be used in conjunction with the DPD circuit 108 to improve the overall linearity and dynamic range of the power amplifier 104.

Specifically, the power amplifier 104 can be biased into deep class AB mode (i.e., the bias can be decreased to near class B mode) to increase the efficiency while utilizing a wide band AM-AM feedback loop to suppress AM-AM distortion. By using the AM-AM feedback loop to first suppress the AM-AM nonlinearity, the overall efficacy of the DPD circuit 108 is greatly improved since the DPD circuit 108 focuses on reducing only the AM-PM nonlinearity. Any residual AM-AM non-linearity in the output of the power amplifier 104 that is not corrected by the AM-AM loop and any AM-PM nonlinearity that is introduced by the AM-AM loop into the output of the power amplifier 104 are compensated by the DPD circuit 108.

Figure 5:
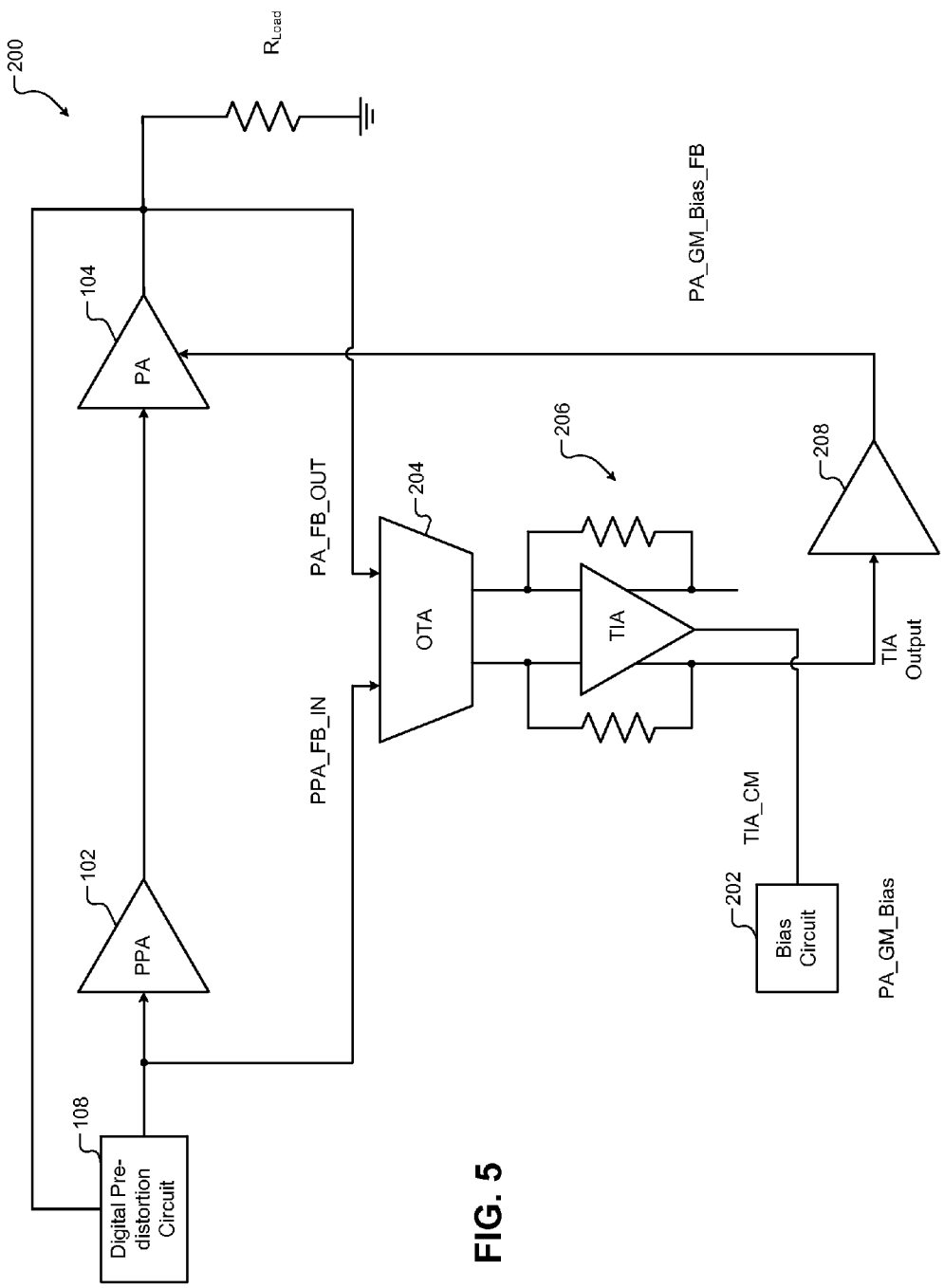
FIG. 5 is a functional block diagram of a feedback system using an operational transconductance amplifier (OTA) as an envelope detector.

FIG. 5 shows a system 200 comprising the pre-amplifier 102, the power amplifier 104, the DPD circuit 108, a bias circuit 202, and an AM-AM feedback loop. The AM-AM feedback loop comprises an operational transconductance amplifier (OTA) 204 and a transimpedance amplifier (TIA) 206. A buffer 208 supplies a bias voltage to the power amplifier 104.

The bias circuit 202 supplies a DC bias (e.g., a replica bias of the power amplifier 104) to bias the common mode of the TIA 206. The OTA 204 detects the envelope information from the input of the pre-amplifier 102 and from the output of the power amplifier 104 and provides AM-AM feedback. At relatively low input power levels (e.g., input power levels not greater than a predetermined threshold), the AM-AM feedback is negligible, and the TIA 206 outputs the DC bias to the buffer 208. At medium and high input power levels (e.g., input power levels greater than the predetermined threshold), the TIA 206 outputs the DC bias modulated by the AM-AM feedback to the buffer 208. Accordingly, the buffer 208 supplies a bias voltage to the power amplifier 104, where the bias voltage is dynamically adjusted based on the AM-AM feedback to compensate the AM-AM nonlinearity in the output of the power amplifier 104.

The OTA 204 acts as a Gm cell (due to low impedance at the input of the TIA 206) while the TIA 206 with the AM-AM feedback provides a well-defined one-pole system. As a result, the OTA 204 and the TIA 206 provide wide bandwidth and a stable system. The TIA 206 with the AM-AM feedback provides a well-defined loop gain with programmability. The system 200 also has an excellent power supply rejection. The overall bandwidth and gain of the system 200 are defined by a time constant of the TIA 206, which has a small gain variation. A relatively low loop gain and wide unity-gain bandwidth provide wide bandwidth and a stable AM-AM feedback loop. A residual gain error, usually within 0.2 dB, can be fixed by the DPD circuit 108.

Figure 6:
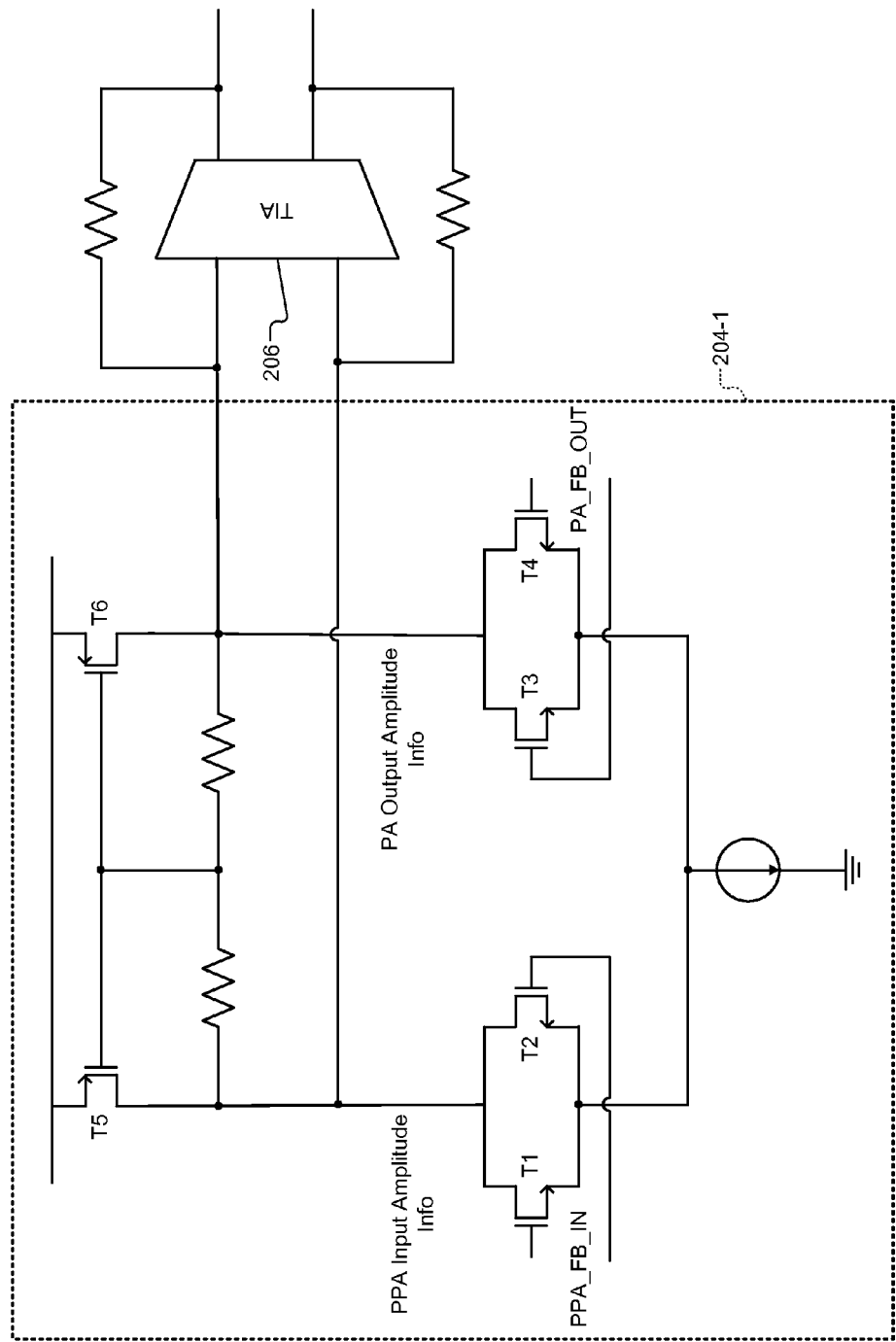
FIG. 6 shows a first example of the OTA of FIG. 5.

FIG. 6 shows a first circuit 204-1 as an example of the OTA 204. The first circuit 204-1 comprises transistors T1-T6. An input stage of the first circuit 204-1 includes transistors T1-T4. Transistors T1 and T2 detect the envelope information (amplitude) from the input of the preamplifier 102. Transistors T3 and T4 detect the envelope information (amplitude) from the output of the power amplifier 104. An output stage of the first circuit 204-1 includes transistors T5 and T6 that compare the two envelope information and output current proportional to a difference between the two envelope information. The TIA 206 converts the current into a voltage and outputs the voltage.

Figure 7:
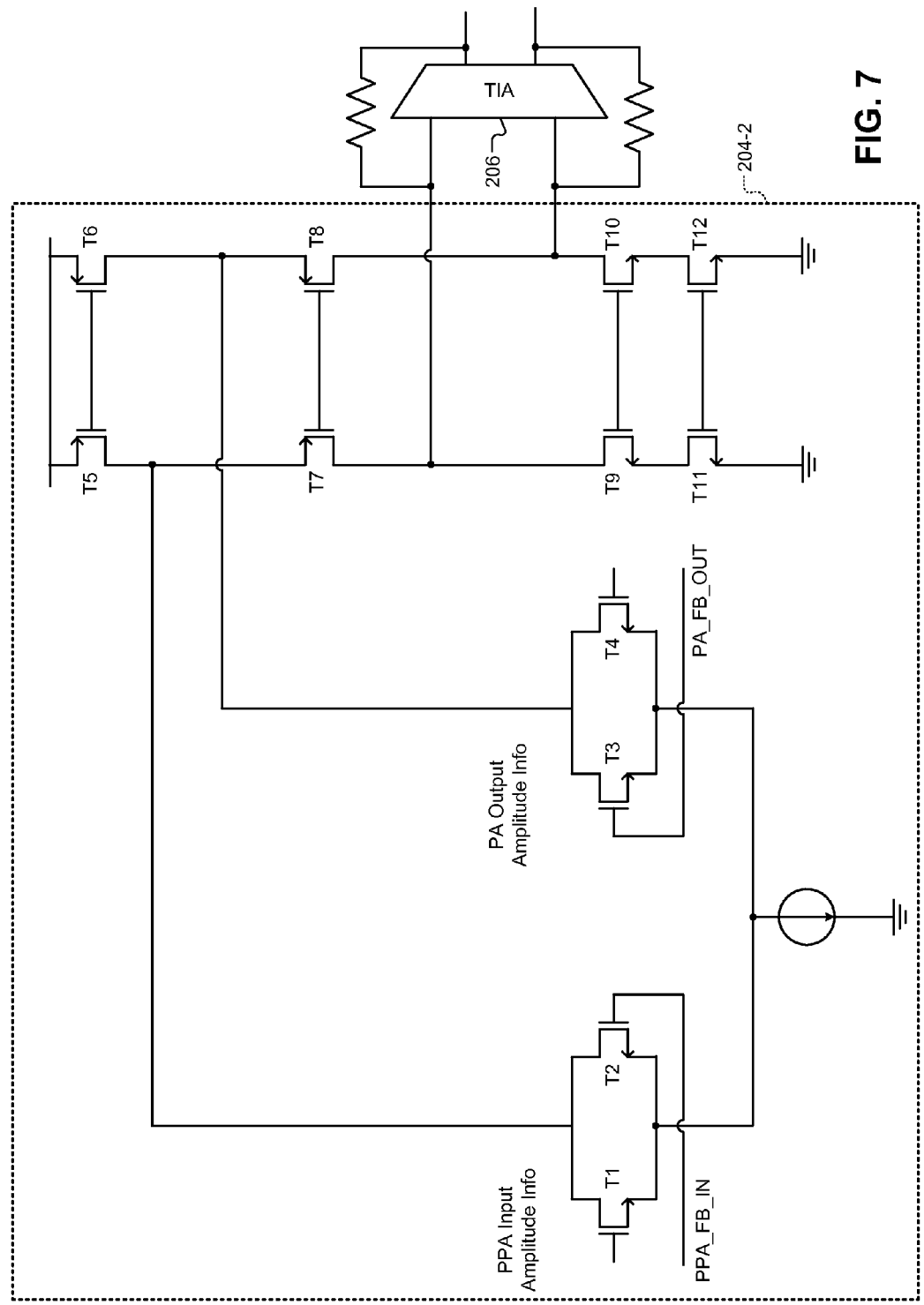
FIG. 7 shows a second example of the OTA of FIG. 5.

FIG. 7 shows a second circuit 204-2 as an example of the OTA 204. The second circuit 204-2 comprises transistors T1-T12. An input stage of the second circuit 204-2 includes transistors T1-T4. Transistors T1 and T2 detect the envelope information (amplitude) from the input of the preamplifier 102. Transistors T3 and T4 detect the envelope information (amplitude) from the output of the power amplifier 104. An output stage of the second circuit 204-2 includes a folded cascode configuration comprising transistors T5-T12. The folded cascode configuration provides a higher loop gain than the output stage of the first circuit 204-1 shown in FIG. 6. The folded cascode configuration outputs current proportional to a difference between the two envelope information. The TIA 206 converts the current into a voltage and outputs the voltage.

Figure 8:
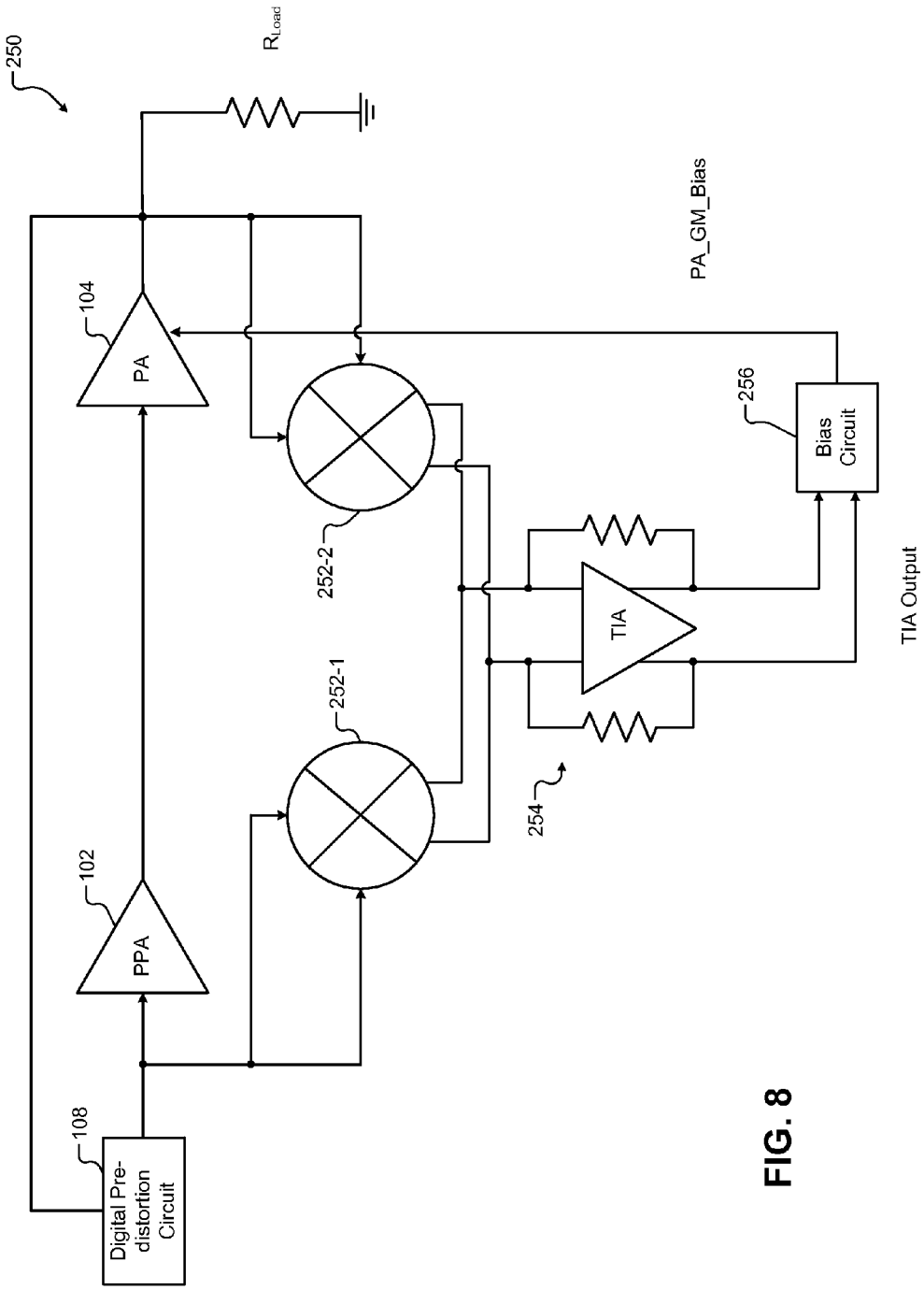
FIG. 8 is a functional block diagram of a feedback system using self-mixers as envelope detectors.

FIG. 8 shows a system 250 comprising the pre-amplifier 102, the power amplifier 104, the DPD circuit 108, and an AM-AM feedback loop utilizing self-mixers instead of an OTA. The system 250 differs from the system 200 shown in FIG. 5 in that the AM-AM feedback loop of the system 250 utilizes self-mixers instead of the OTA. The system 250 further comprises a first self-mixer 252-1, a second self-mixer 252-2, a transimpedance amplifier 254, and a bias circuit 256.

The first self-mixer 252-1 receives the input of the preamplifier 102 and detects the envelope information (amplitude) from the input of the preamplifier 102. The second self-mixer 252-2 receives the output of the power amplifier 104 and detects the envelope information (amplitude) from the output of the power amplifier 104. The first self-mixer 252-1 and the second self-mixer 252-2 each outputs first and second outputs.

The first outputs of the first self-mixer 252-1 and the second self-mixer 252-2 are input to a first input of the TIA 254. The second outputs of the first self-mixer 252-1 and the second self-mixer 252-2 are input to a second input of the TIA 254. The bias circuit 256 generates a bias voltage based on the output of the TIA 254 to bias the power amplifier 104.

The OTA 204 of the system 200 shown in FIG. 5 and the self-mixers 252-1, 252-2 of the system 250 shown in FIG. 8 provide square functions to detect the envelopes in the input and the output of the power amplifier 104. While the square function provided by the OTA 204 is dependent on the length of the long channel of the OTA 204, the self-mixers 252-1, 252-2 provide an exact square function.

Additionally, the system 250 provides the following advantages. The system 250 provides a well-defined gate bias for the power amplifier 104. The TIA 254 with feedback provides a well-defined loop gain with programmability similar to the system 200. The overall loop bandwidth of the system 250 is limited only by the TIA 254. The self-mixers 252-1, 252-2 are very wide bandwidth circuits. The system 250 therefore can provide very wide bandwidth.

Figure 9:
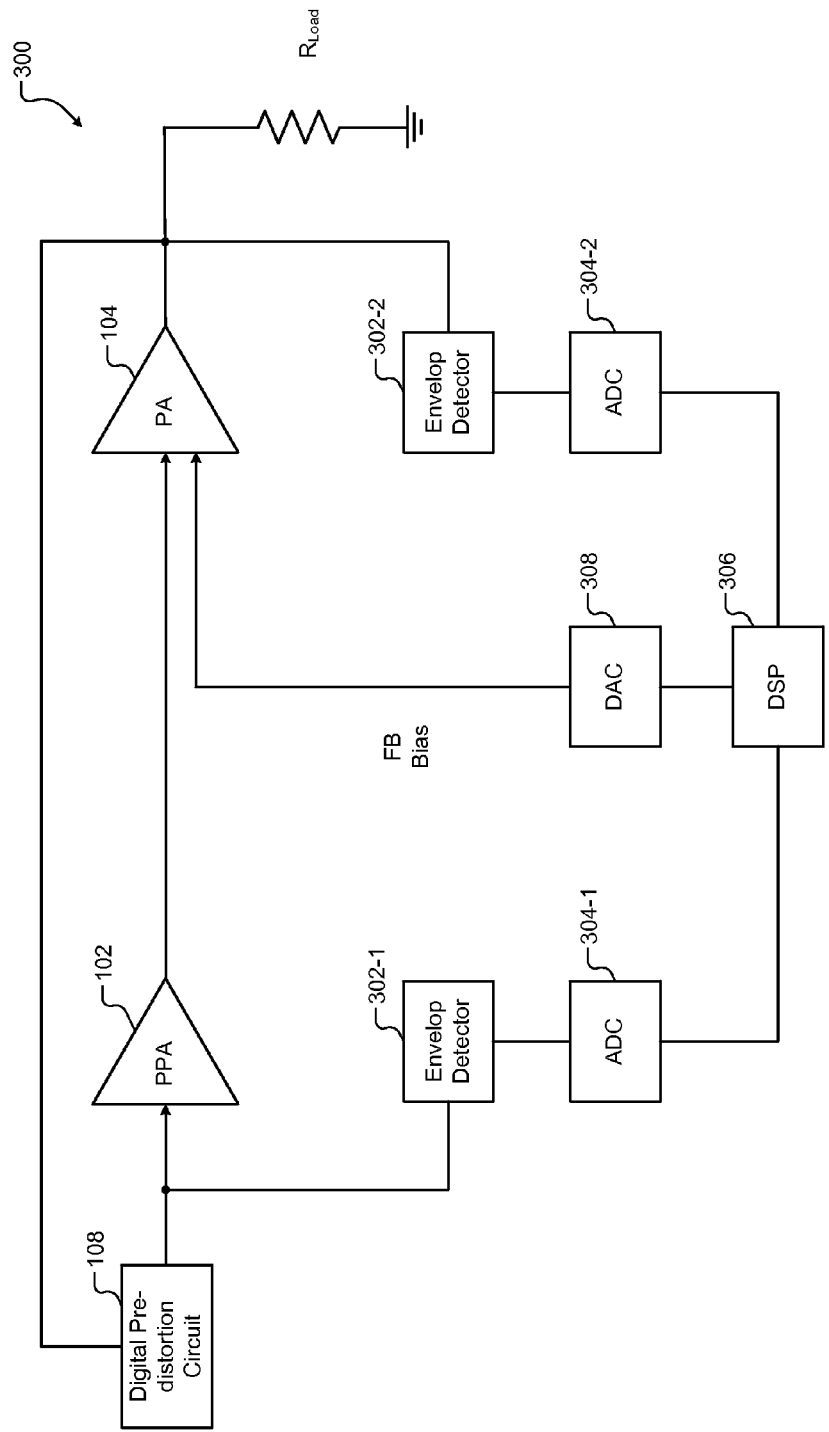
FIG. 9 is a functional block diagram of a feedback system that uses analog-to-digital converters (ADCs) to digitize feedback.

FIG. 9 shows a system 300 that uses analog-to-digital converters (ADCs) to digitize the AM-AM feedback. The system 300 comprises the pre-amplifier 102, the power amplifier 104, the DPD circuit 108, a first envelope detector 302-1, a second envelope detector 302-2, a first ADC 304-1, a second ADC 304-2, a digital signal processor (DSP) 306, and a digital-to-analog converter (DAC) 308.

The first envelope detector 302-1 detects the envelope information (amplitude) from the input of the preamplifier 102. The second envelope detector 302-2 detects the envelope information (amplitude) from the output of the power amplifier 104. The first ADC 304-1 converts the envelope information from the input of the preamplifier 102 from analog to digital format. The second ADC 304-2 converts the envelope information from the output of the power amplifier 104 from analog to digital format.

The DSP 306 processes the outputs of the first and second ADCs 304-1, 304-2 (i.e., the digitized envelope information from the input of the preamplifier 102 and the output of the power amplifier 104). The DSP 306 generates bias information to bias the power amplifier 104 based on the digitized envelope information from the input of the preamplifier 102 and the output of the power amplifier 104. The DAC 308 converts the bias information generated by the DSP 306 from digital to analog format and supplies bias to the power amplifier 104.

Figure 10:
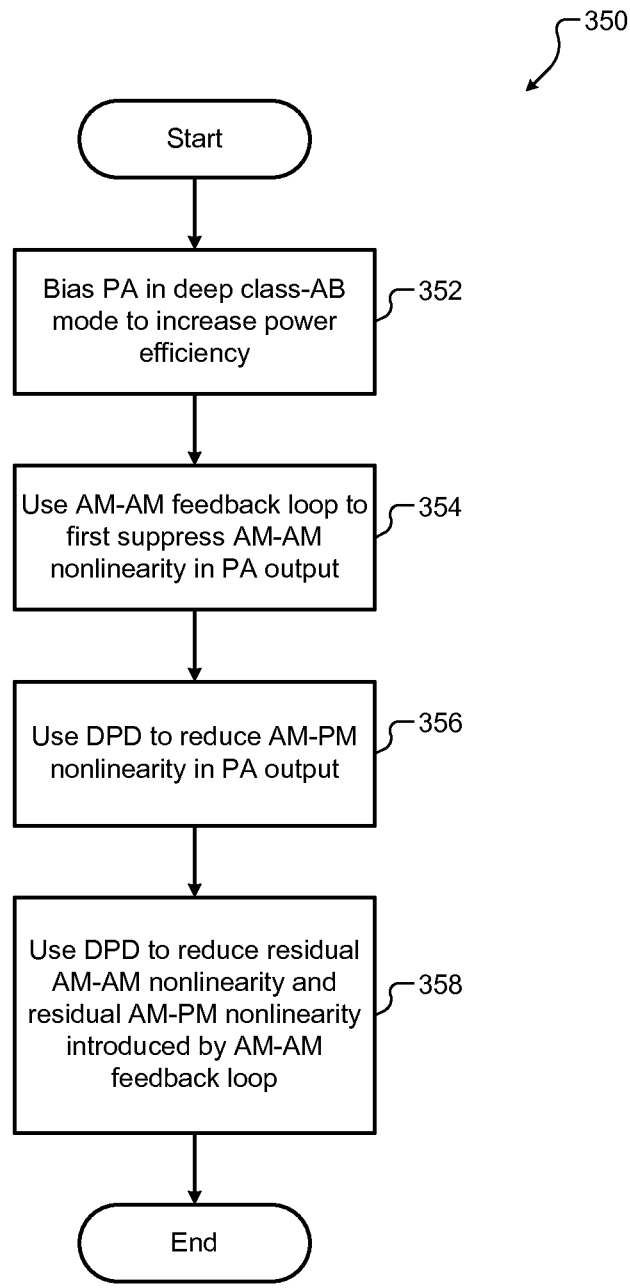
FIG. 10 is a flowchart of a method for increasing power efficiency and decreasing nonlinearity of power amplifiers.

FIG. 10 shows a flowchart of a method 350 for increasing power efficiency and decreasing nonlinearity of power amplifiers. At 352, a power amplifier is biased in deep class-AB mode. At 354, an AM-AM feedback loop is used to reduce AM-AM nonlinearity in the output of the power amplifier. At 356, a DPD circuit is used to reduce AM-PM nonlinearity in the output of the power amplifier. At 358, the DPD circuit is used to reduce any residual AM-AM nonlinearity remaining in the output of the power amplifier and any residual AM-PM nonlinearity introduced into the output of the power amplifier by the AM-AM feedback loop.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

What is claimed is:

1. A system comprising:
an amplifier circuit configured to amplify an input and generate a first output;
a bias circuit configured to bias the amplifier circuit;
a feedback circuit configured to
generate feedback based on the input and the first output, and
adjust a bias of the amplifier circuit based on the feedback to reduce amplitude nonlinearity in the first output,
wherein the feedback circuit comprises:
an operational transconductance amplifier configured to receive the input and the first output and generate a second output; and
a transimpedance amplifier configured to receive the second output and generate a third output to adjust the bias of the amplifier circuit; and
a digital pre-distortion circuit configured to reduce phase nonlinearity in the first output.

2. The system of claim 1, wherein:
the amplifier circuit comprises
a pre-amplifier configured to amplify the input and generate a second output; and
a power amplifier configured to amplify the second output and generate the first output;
the bias circuit is configured to bias the amplifier circuit by biasing the power amplifier; and
the feedback circuit is configured to adjust the bias of the amplifier circuit by adjusting the bias of the power amplifier.

3. The system of claim 1, wherein the digital pre-distortion circuit is configured to reduce residual phase nonlinearity generated by the feedback circuit in the first output.

4. The system of claim 1, wherein the digital pre-distortion circuit is configured to reduce residual amplitude nonlinearity in the first output.

5. The system of claim 1, wherein:
the operational transconductance amplifier comprises a comparator configured to compare amplitude information of the input and the first output and to generate current based on the comparison, and
the transimpedance amplifier is configured to generate the second output based on the current.

6. The system of claim 1, wherein the operational transconductance amplifier comprises:
a current source; and
first through sixth transistors each including a source terminal, a gate terminal, and a drain terminal;
wherein the source terminals of the first through fourth transistors are connected to the current source;
wherein the gate terminals of the first and second transistors are connected to the input;
wherein the gate terminals of the third and fourth transistors are connected to the first output;
wherein the drain terminals of the first and second transistors are connected to the drain terminal of the fifth transistor and a first input of the transimpedance amplifier;
wherein the drain terminals of the third and fourth transistors are connected to the drain terminal of the sixth transistor and a second input of the transimpedance amplifier;
wherein the source terminals of the fifth and sixth transistors are connected to a power supply;
wherein the gate terminal of the fifth transistor is connected to the gate terminal of the sixth transistor;
wherein a first resistance including first and second terminals respectively connected to the drain and gate terminals of the fifth transistor; and
wherein a second resistance including first and second terminals respectively connected to the drain and gate terminals of the sixth transistor.

7. The system of claim 5, wherein the operational transconductance amplifier comprises a folded cascode stage coupled to the comparator to generate the current.

8. The system of claim 1, wherein the operational transconductance amplifier comprises:
a current source; and
first through twelfth transistors each including a source terminal, a gate terminal, and a drain terminal;
wherein the source terminals of the first through fourth transistors are connected to the current source;
wherein the gate terminals of the first and second transistors are connected to the input;
wherein the gate terminals of the third and fourth transistors are connected to the first output;
wherein the drain terminals of the first and second transistors are connected to the drain terminal of the fifth transistor;
wherein the drain terminals of the third and fourth transistors are connected to the drain terminal of the sixth transistor;
wherein the source terminals of the fifth and sixth transistors are connected to a power supply and the source terminal of the seventh transistor;
wherein the gate terminals of the fifth, seventh, ninth, and eleventh transistors are respectively connected to the gate terminals of the sixth, eighth, tenth, and twelfth transistors;
wherein the drain terminals of the fifth and sixth transistors are respectively connected to the source terminals of the seventh and eighth transistors;
wherein the drain terminals of the seventh and eight transistors are respectively connected to (i) the drain terminals of the ninth and tenth transistors and (ii) first and second inputs of the transimpedance amplifier; and
wherein source terminals of the ninth and tenth transistors are respectively connected to the drain terminals of the eleventh and twelfth transistors.

9. A system comprising:
an amplifier circuit configured to amplify an input and generate a first output;
a bias circuit configured to bias the amplifier circuit;
a feedback circuit configured to
generate feedback based on the input and the first output, and
adjust a bias of the amplifier circuit based on the feedback to reduce amplitude nonlinearity in the first output,
wherein the feedback circuit comprises:
a first self-mixer configured to receive the input and generate a second output;
a second self-mixer configured to receive the first output and generate a third output; and
a transimpedance amplifier configured to receive the second output and the third output and generate a fourth output to adjust the bias of the amplifier circuit; and
a digital pre-distortion circuit configured to reduce phase nonlinearity in the first output.

10. A method comprising:
amplifying an input using an amplifier circuit;
generating a first output based on amplifying the input;
biasing the amplifier circuit;
generating feedback based on the input and the first output;
adjusting a bias of the amplifier circuit based on the feedback to reduce amplitude nonlinearity in the first output,
wherein generating feedback and adjusting the bias of the amplifier circuit based on the feedback includes:
generating a second output based on the input and the first output using an operational transconductance amplifier;
generating a third output based on the second output using a transimpedance amplifier; and
adjusting the bias of the amplifier circuit using the third output; and
reducing phase nonlinearity in the first output.

11. The method of claim 10, further comprising:
amplifying the input using a pre-amplifier;
generating a second output based on amplifying the input using the pre-amplifier;
amplifying the second output using a power amplifier;
generating the first output based on amplifying the second output using the power amplifier;
biasing the amplifier circuit by biasing the power amplifier; and
adjusting the bias of the amplifier circuit by adjusting the bias of the power amplifier.

12. The method of claim 10, further comprising reducing residual phase nonlinearity generated by the feedback in the first output.

13. The method of claim 10, further comprising reducing residual amplitude nonlinearity in the first output.

14. The method of claim 10, further comprising:
comparing amplitude information of the input and the first output;
generating current based on the comparison; and
generating the second output based on the current.

15. The method of claim 14, further comprising generating the current using a folded cascode stage of the operational transconductance amplifier.

16. A method comprising:
amplifying an input using an amplifier circuit;
generating a first output based on amplifying the input;
biasing the amplifier circuit;
generating feedback based on the input and the first output;
adjusting the bias of the amplifier circuit based on the feedback to reduce amplitude nonlinearity in the first output;
generating a second output based on the input using a first self-mixer;
generating a third output based on the first output using a second self-mixer;
generating a fourth output based on the second output and the third output using a transimpedance amplifier to adjust the bias of the amplifier circuit; and
reducing phase nonlinearity in the output.

* * * * *